United States Patent [19]

Tanaka

[11] Patent Number: 4,680,079
[45] Date of Patent: Jul. 14, 1987

[54] PRINTED CIRCUIT BOARD LAMINATING APPARATUS

[75] Inventor: Shoji Tanaka, Oyama, Japan

[73] Assignee: Fujitsu Limited, Kawasaki, Japan

[21] Appl. No.: 711,635

[22] Filed: Mar. 14, 1985

[30] Foreign Application Priority Data

| Mar. 16, 1984 | [JP] | Japan | 59-049232 |
| Mar. 24, 1984 | [JP] | Japan | 59-055242 |
| Mar. 26, 1984 | [JP] | Japan | 59-056150 |
| Mar. 26, 1984 | [JP] | Japan | 59-057652 |
| Mar. 26, 1984 | [JP] | Japan | 59-057653 |

[51] Int. Cl.⁴ .......................................... B32B 31/00
[52] U.S. Cl. .................................. 156/353; 156/364; 156/522; 156/552; 156/555
[58] Field of Search .............. 156/464, 521, 522, 552, 156/361, 353, 364, 324, 555, 302, 299

[56] References Cited

U.S. PATENT DOCUMENTS

| 3,547,730 | 12/1970 | Cohen et al. | 156/345 |
| 4,214,936 | 7/1980 | Del Bianco | 156/361 X |
| 4,290,841 | 9/1981 | Fukuhara | 156/464 |

FOREIGN PATENT DOCUMENTS 0093385 11/1983 European Pat. Off. .
1652289 1/1971 Fed. Rep. of Germany .
2935418 3/1981 Fed. Rep. of Germany .
1462471 of 0000 France .

OTHER PUBLICATIONS

European Search Report dated Dec. 18, 1985 for EPC Appln No. 85103025.

Primary Examiner—David Simmons
Attorney, Agent, or Firm—Staas & Halsey

[57] ABSTRACT

A printed circuit board laminator adapted for laminating a film on the surfaces of the baseboards of printed circuit boards. The laminator comprises a laminating mechanism which can continuously laminate a long film on the continuously fed baseboards. The laminator comprises a constant-gap baseboard feed mechanism, which can arrange the baseboards with a constant gap therebetween, and continuously feed them to the laminating mechanism. The laminator further comprises an access hole-making unit which can make access holes in the film to be aligned with indexing holes in the baseboards, prior to the lamination. The laminator also comprises a cutting mechanism which can cut the film laminated to the boards for separating the latter from each other.

12 Claims, 27 Drawing Figures

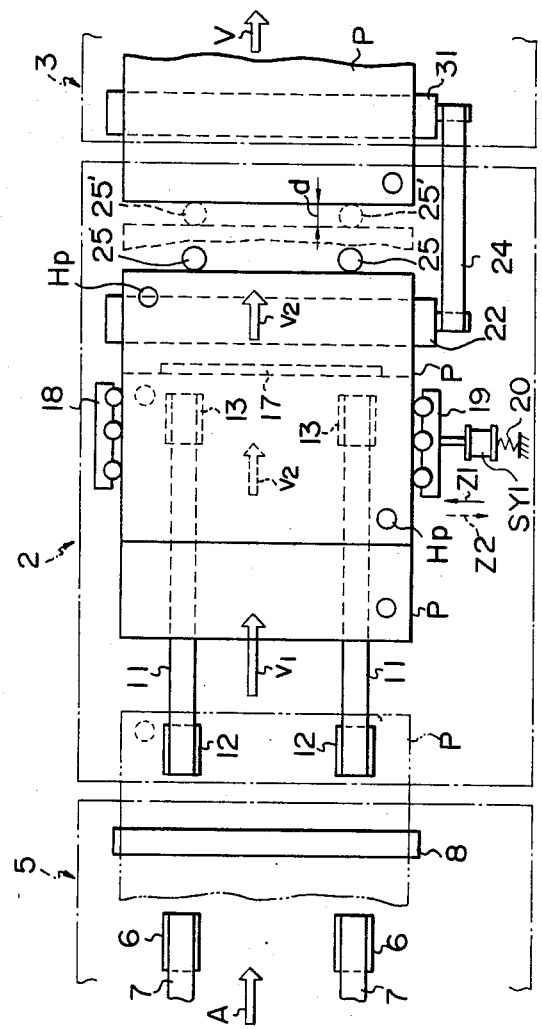

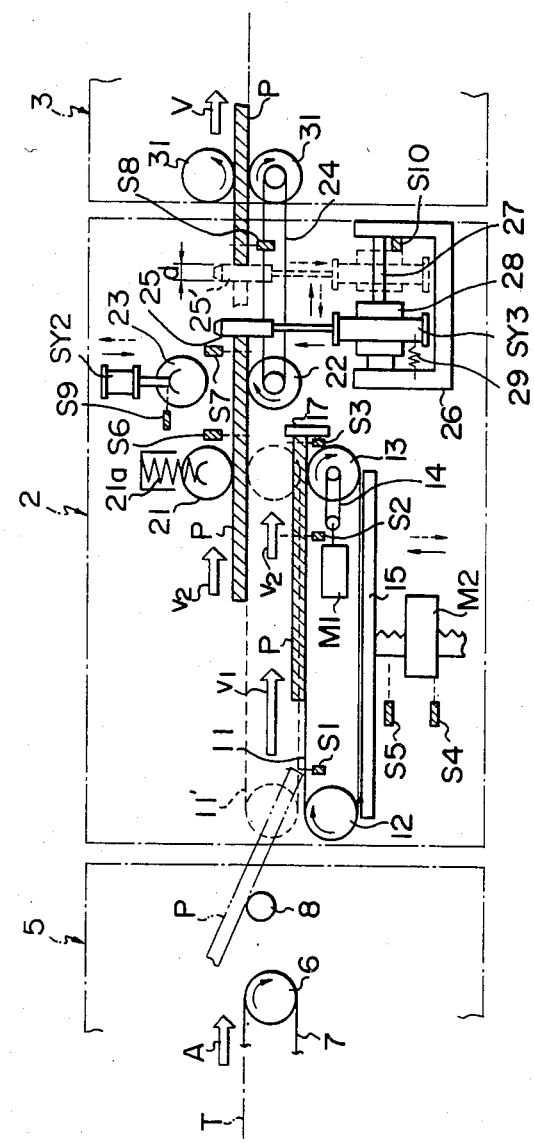

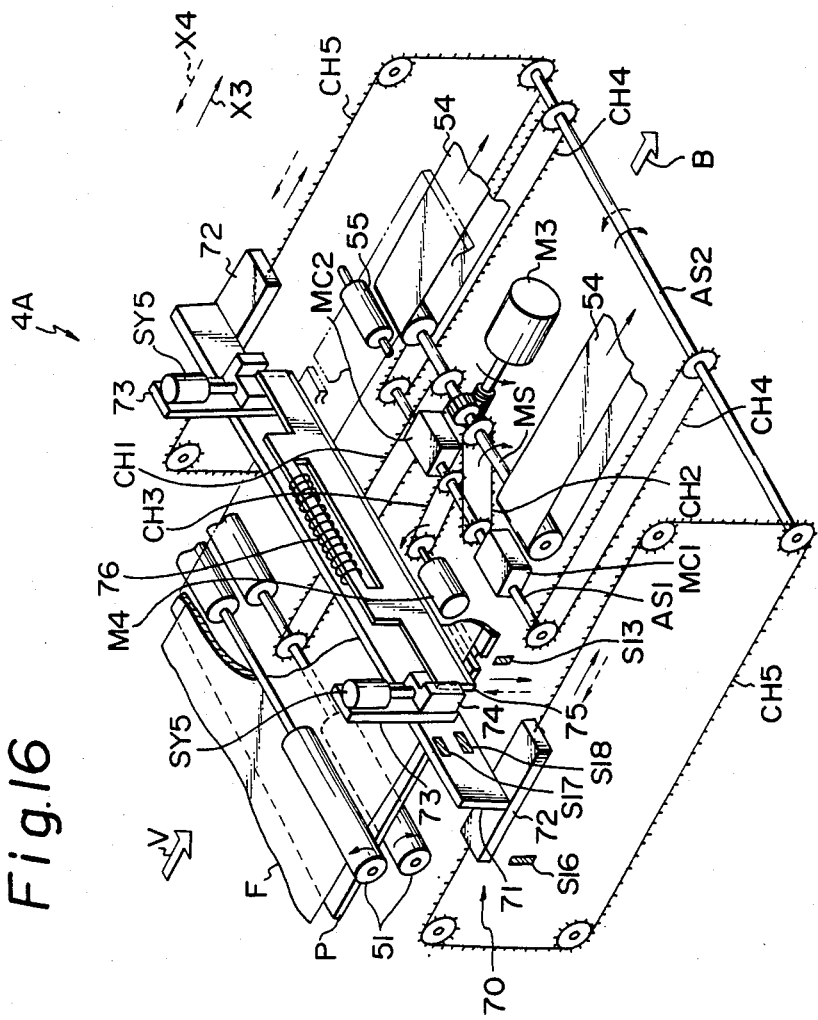

PRINTED CIRCUIT BOARD LAMINATING APPARATUS

BACKGROUND OF THE INVENTION

1. Field of the Invention

The present invention relates to an apparatus adapted for use in manufacturing printed circuit boards. More particularly, it relates to a printed circuit board laminating apparatus (or laminator) for laminating the surface of the baseboard of a printed circuit board (hereinafter referred to as baseboard or board) with a film, such as dry photoresist film (hereinafter referred to as resist film) or protective film.

2. Description of the Prior Art

Conventionally, the printed circuit board is manufactured by forming a layer of photoresist on the surface of a layer of the conductive material of a baseboard, such as a copper-clad board, and then forming a wiring pattern thereon by a photolithographic technique. In this method, the photoresist layer is formed mainly by laminating a resist film onto the surface of the baseboard.

Conventionally, the lamination of the resist film onto the baseboard is performed in such a manner that a piece of resist film having a length corresponding to that of the board is cut from a long resist film and laminated onto the board. However, this method is inefficient and is not suitable for mass-production procedures.

Accordingly, a laminator which can continuously laminate a long resist film onto boards, without cutting the film, was recently developed. However, this conventional laminator still has the following problems.

Namely, this conventional laminator is constructed in such a manner that the boards are continuously fed, with a gap therebetween, by, for example, feed rollers, while a long resist film is continuously supplied by means of a laminating roll and laminated by thermocompression onto the surfaces of the boards.

According to this type of laminator, the boards laminated with the resist film are fed out of the laminator while still being interconnected by the resist film. Accordingly, to separate the boards, the resist film must be cut between the boards. Also, the board is usually provided with indexing holes (or pilot holes or adjusting holes) used for positioning the board in subsequent steps of the process. Thus, the resist film must be also provided with access holes to enable access to the indexing holes in the boards.

However, the conventional laminator is not provided with means for cutting the resist film and making the access holes. Accordingly, after the laminating process, the resist film and the access holes must be cut by hand with a knife, or the like. This means that there is no saving in labor, and that without the provision of automation in the printed circuit board manufacturing line, the process is inefficient, and productivity is low. There is a further disadvantage in that the inaccuracy in cutting the resist film and making the access holes and the scraps of the resist film and board which invariably adhere to the resist film lead to errors in the subsequent photolithographing step, which results in inferior quality and thus, a low yield, of the printed circuit boards.

Furthermore, in the laminator as described above, the gap between the boards fed into the laminator from the preceding board-processing section or board accumulator is important. For example, where the gap is too small, the cutting of the resist film after lamination can not be successfully performed. On the other hand, where the gap is too large, the end portions of the resist film protruding from the board, after being cut, tend to turn or roll over, thereby increasing the disadvantages described above.

SUMMARY OF THE INVENTION

An object of the present invention is to provide a printed circuit board laminator which can perform a constant-gap feed of the baseboards.

Another object of the present invention is to provide a laminator which can automatically, efficiently and precisely make access holes in the resist film prior to the lamination.

A further object of the present invention is to provide a laminator which can automatically, efficiently and precisely perform the cutting of the resist film after the lamination.

Further, it is an object of the present invention to provide a printed circuit board laminator which can automatically and efficiently perform the constant-gap feed of the boards, make access holes in the resist film prior to the lamination, continuously laminate the resist film onto the boards, and cut the resist film after the lamination, thereby realizing automation of and an improvement in productivity in the printed circuit board laminating step, in quality, and in the yield of the printed circuit boards.

According to one embodiment of the present invention, there is provided a printed circuit board laminator which comprises: (1) laminating means for continuously feeding a long film, and continuously laminating the film on the surfaces of the baseboards; and (2) board feed means for arranging the baseboards with a constant gap therebetween, and feeding the baseboards to the laminating means at a regular velocity.

According to another embodiment of the present invention, there is provided a printed circuit board laminator which comprises: (1) laminating means for continuously feeding a long film to a laminating position, and continuously laminating the film on the surfaces of the baseboards; and (2) access hole-making means for making access holes in the films, in the path of the feed of the film to the laminating position, so as to be aligned with the indexing holes in the baseboards.

According to a further embodiment of the present invention, there is provided a printed circuit board laminator which comprises: (1) means for continuously feeding a long film, and continuously laminating the film on the surfaces of the baseboards; and (2) cutting means for cutting the film at the portion corresponding to the gap between the boards which are continuously fed by the laminating means.

Further, according to still another embodiment of the present invention, there is provided a printed circuit board laminator which comprises the above-described laminating means, board feed means, access hole-making means, and cutting means.

The present invention will now be described in detail based on the preferred embodiments with reference to the accompanying drawings.

BRIEF DESCRIPTION OF THE DRAWINGS

FIGS. 4 and 5 are a plan view and a side view, respectively, of the timing section of the laminator;

FIG. 16 is a perspective view of a second embodiment of the cutting section of the laminator.

DETAILED DESCRIPTION OF THE PREFERRED EMBODIMENTS

Figure 1:
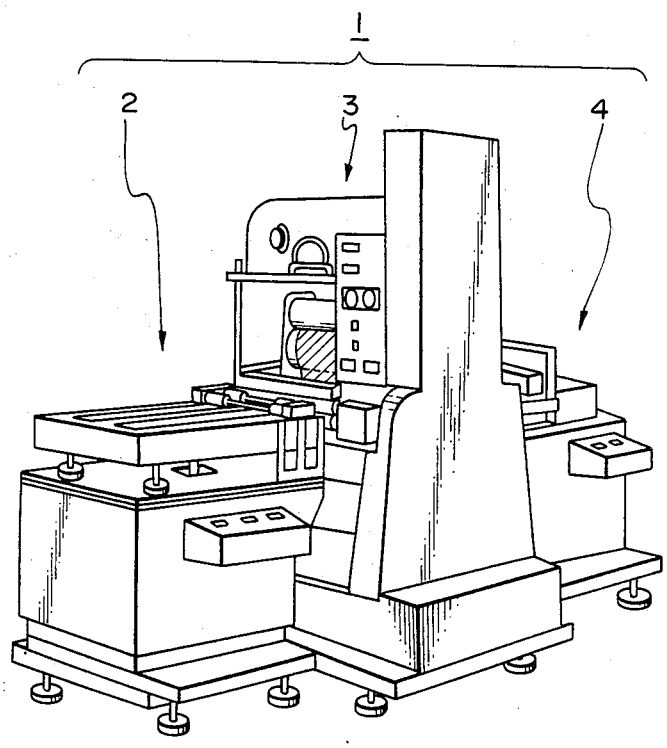
FIG. 1 is a perspective view of an embodiment of a printed circuit board laminator according to the present invention.
Figure 2:
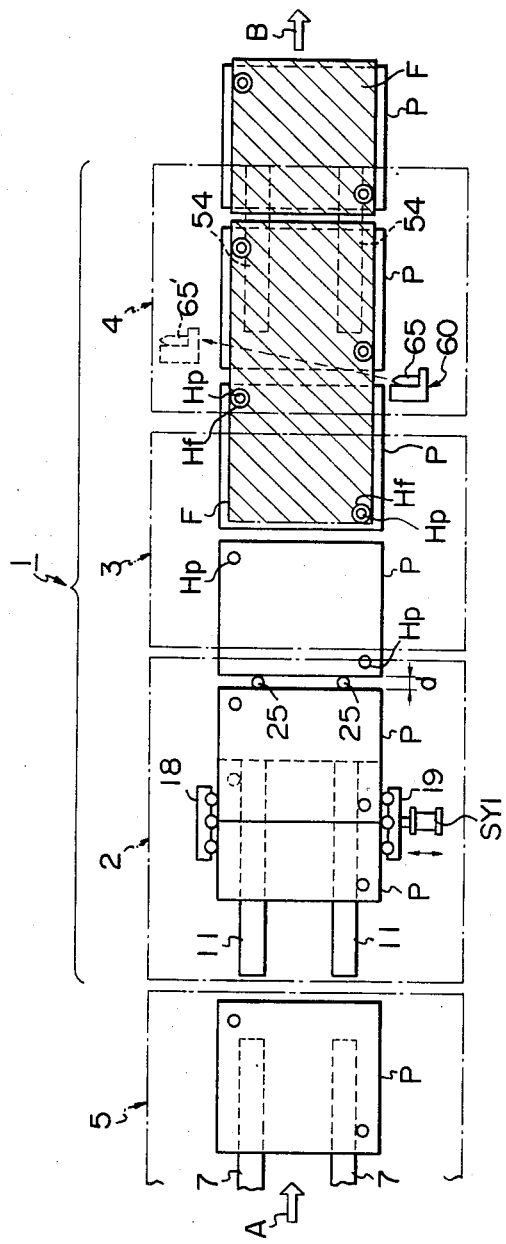
FIGS. 2 and 3 are a plan view and a side view, respectively, schematically illustrating the entire construction of the laminator.
Figure 3:
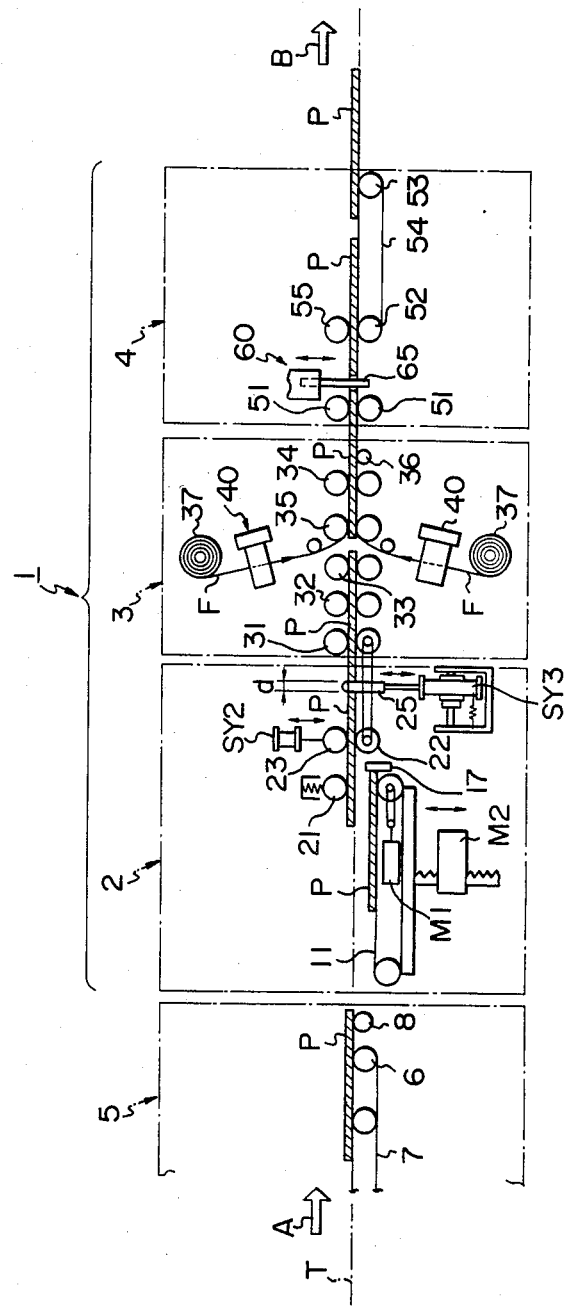

Referring to FIGS. 1, 2, and 3, reference numeral 1 designates a laminator which basically comprises a timing section 2, a laminating section 3, and a cutting section 4. Reference numeral 5 in FIGS. 2 and 3 designates a board feeder for feeding baseboards P into the laminator 1 from the preceding board-processing section or board accumulator (not illustrated).

1. General Construction and Operation

First, the general construction and operation of the board feeder 5 and of sections 2, 3, and 4 of the laminator 1 will be described with reference to FIGS. 2 and 3. The board feeder 5 comprises a pair of feed belts 7 supported horizontally by pulleys 6, which feeds the boards P horizontally in the direction of the arrow A along a horizontal feed path T (shown by the dotted line in FIG. 3), and supplies the boards P to the timing section 2 of the laminator 1 via a freely rotatable support roller 8.

The timing section 2 of the laminator 1 is provided with a constant-gap board feed mechanism comprising quick-feed belts 11, a stopper 17, a guide roller unit 18 and an alignment roller unit 19 (FIG. 2), clamp rollers 21, feed rollers 22 and 23, and spacing pins 25. The timing section 2 functions to continuously feed the boards P, supplied from the board feeder 5, into the laminating section 3, with the boards lined up and having a predetermined constant gap d (for example, 2 to 3 mm) therebetween, accurately oriented in the board feed direction, and moving at a predetermined regular velocity V (for example, 0.5~2 m/minute).

The laminating section 3 is provided with a laminating mechanism comprising feed rollers 31, 32, 33, and 34, laminating rolls 35, freely rotatable support rollers 36, resist film reels 37, and an access hole-making mechanism comprising die-punch units 40. The laminating section 3 continuously feeds the boards P, fed from the preceding timing section 2, with the gap d therebetween maintained, at the regular velocity V, and continuously supplies two long resist films F (hatched in FIG. 2) at the same velocity as that of the board feed. The laminating section 3 also makes access holes Hf (FIG. 2) in the resist films F, which correspond to the indexing holes Hp (FIG. 2) in the boards P, then continuously laminates the resist films F by thermo-compression applied to the top and bottom surfaces of the boards P, and thereafter, delivers the laminated boards P and resist films F to the subsequent cutting section 4.

The cutting section 4 includes a cutting mechanism comprising feed rollers 51, feed belts 54, and a cutter 60, continuously feeds the laminated boards P and resist films F, fed from the laminating section 3, cuts the resist films F at the portions corresponding to the gaps between the boards P to separate the boards, and thereafter delivers the boards toward the subsequent board processing section or board accumulator (not illustrated) as shown by the arrow B.

Sections 2, 3, and 4 of the laminator 1 will now be described in detail.

2. Timing Section

Referring to FIGS. 4 and 5, in which the timing section 2 is illustrated together with the respective parts of the board feeder 5 and the laminating section 3, the quick-feed belts 11 of the constant-gap board feed mechanism in the timing section 2 are disposed adjacent to the board feeder 5 and along the board feed path T (FIG. 5). The quick-feed belts 11 are supported horizontally by a pair of pulleys 12 and 13 and driven by a two-speed motor M1 connected to the pulleys 13 by a belt or chain 14, thereby providing two high speeds, each larger than the regular velocity V, for quick feeding the board P, i.e., a higher velocity $v_1$ and a velocity $v_2$ relatively slower than the velocity $v_1$ ($V<v_2<v_1$). The reference characters S1, S2, and S3 designate sensors for detecting that the board P is supplied from the board feeder 5 onto the quick-feed belts 11 and then fed at the required speed. These sensors are photosensors, each comprising a light-emitting cell and a photoelectric receiving cell (not illustrated in detail).

The quick-feed belts 11 are also mounted on a support 15 which can be moved vertically by a linear motor M2, in such a manner that the quick-feed belts 11 are moved up and down between a lower position (home position), shown by the solid line in FIG. 5, in which the upper surfaces of the belts are below the level of the board feed path T, and an upper position, shown by the dotted line 11′, in which the upper surfaces of the belts are on substantially the same level as the board feed path T. The lifting stroke of the quick feed belts 11 may be, for example, from 15 to 20 mm. The stopper 17 is disposed adjacent to the ends of the quick-feed belts 11 when they are in the home position. The stopper 17 stops the board P, fed at a required speed by the quick-feed belts 11, at a predetermined waiting position, as described hereinafter. The reference characters S4 and S5 designate sensors for detecting that the quick-feed belts 11 are in the home position and the upper position, respectively. These sensors may be the photosensors described above or mechanical microswitches.

Referring to FIG. 4, on respective sides of the quick-feed belts 11 the stationary guide roller unit 18 and the alignment roller unit 19, which is movable in the horizontal direction (shown by the arrows Z1 and Z2), are disposed perpendicularly to the board feed path T. The alignment roller unit 19 is driven by a cylinder actuator SY1 using, for example, compressed air, to push the board P, placed in the waiting position on the quick-feed belts 11, against the guide roller unit 18, to ensure that the board P is located in a predetermined position and accurately oriented in the direction of the board feed. A spring 20 is used for adjusting the board-pushing force of the cylinder actuator SY1.

Referring to FIG. 5, the clamp rollers 21 are disposed above the quick-feed belts 11 and opposite the pulleys 13. The clamp rollers 21 are normally forced downward by springs 21a and, when the quick-feed belts 11 are in the upper position, exert a clamping pressure on the board P and cooperate with the quick-feed belts 11 to feed the board P at the lower velocity $v_2$, as described hereinafter.

The feed rollers 22 and 23 are disposed in the region subsequent to the clamp rollers 21, i.e., adjacent to the laminating section 3. The lower feed roller 22 is always driven by a belt or chain 24 synchronously with the feed roller 31 in the laminating section 3, to feed the board P at the regular velocity V. The upper feed roller 23 is a driven roller which can be moved up and down by a cylinder actuator SY2 using, for example, compressed air. The upper feed roller 23 is normally held in the upper position (home position), so that the board P, when being fed at the required speed by the quick-feed belts 11 and the clamp rollers 21, can freely pass between the feed rollers 22 and 23. But, after the quick board feed is finished, the upper feed roller 23 is moved down to clamp the board P and to cooperate with the lower feed roller 22 to feed the board P at the regular velocity V, as described hereinafter. The reference characters S6, S7, and S8 designate photosensors, as described hereinbefore, for detecting the board P fed at the required speed or at the regular velocity along the board feed path T, and S9 designates a photosensor or microswitch, as described hereinbefore, for detecting the lower position of the upper feed roller 23.

Two spacing pins 25 are disposed in the region subsequent to the feed rollers 22 and 23, i.e., adjacent to the laminating section 3. The diameter of the spacing pins 25 is equal to the predetermined board gap d and the pins 25 are moved up and down by cylinder actuators SY3 using, for example, compressed air, to be inserted into and extracted from the gap between the boards P. The cylinder actuators SY3 are secured to a slider 28 engaging horizontal guide rods 27 fixed to a mounting base 26 in such a manner that the spacing pins 25 can be moved in parallel to the board feed path T between the preceding position, shown by the solid line in FIG. 5, adjacent to the feed rollers 22 and 23 and the subsequent position, shown by the dotted line 25' adjacent to the feed rollers 31.

As described hereinafter, the spacing pins 25 are normally held in the lower position (home position) and, after the trailing end of the board P has passed the spacing pins 25, they are moved up as shown in FIG. 5. Then, when the succeeding board P is fed at the required speed by the quick-feed belts 11 and the clamp rollers 21, the spacing pins 25 are pushed by the leading end of the succeeding board against the trailing end of the preceding board P, as shown by the dotted line 25' in FIG. 5, whereby the gap d between the preceding and succeeding boards is established. Thereafter, the spacing pins 25 are extracted from the gap between the boards P and returned to the home position by a restoring spring 29 set between the mounting base 26 and the slider 28. The reference character S10 designates a photosensor or microswitch, as described hereinbefore, for detecting the subsequent position of the slider 28, i.e., the position 25' of the spacing pins 25.

The constant-gap feed of the boards P performed in the above-described timing section 2 will now be described in detail with reference to FIGS. 6A through 6K and 7. Note, FIGS. 6A through 6K illustrate only related portions and FIG. 7 shows the operations of the sensors S1 to S10, the motors M1 and M2, and the cylinder actuators SY1 to SY3.

Figure 6A:
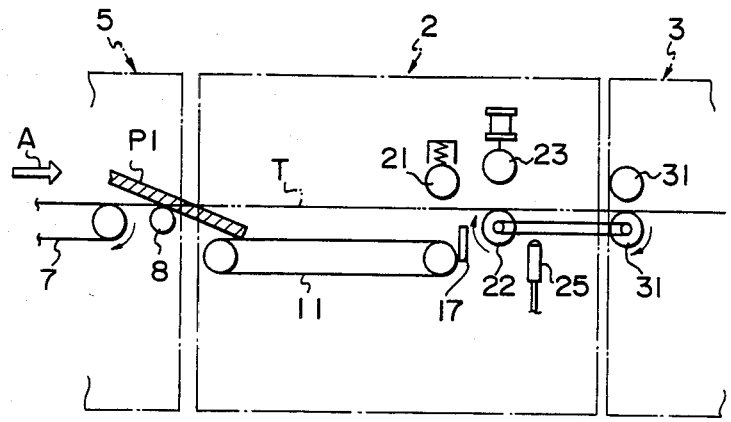
FIGS. 6A to 6K are side views illustrating the successive steps of the constant-gap feed of the baseboards in the timing section.
Figure 7:
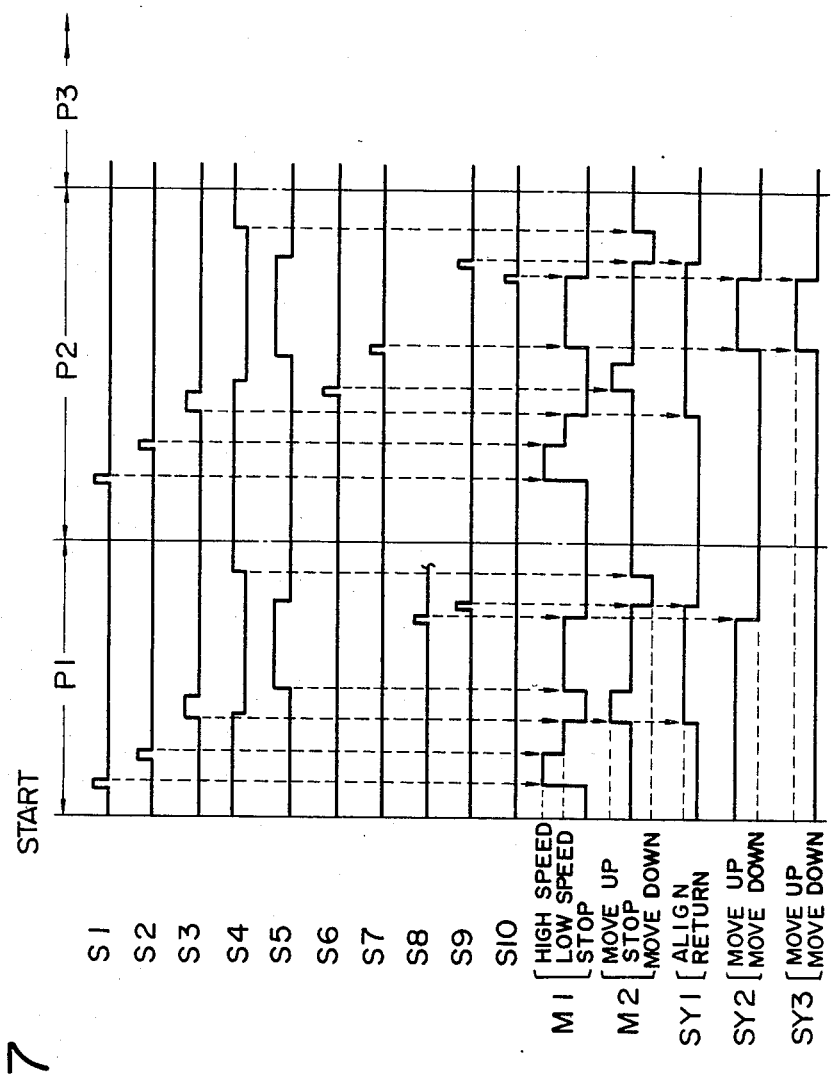
FIG. 7 is graphic view of the time chart for the constant-gap feed of the baseboards.

Referring to FIG. 6A, it is first assumed that, at the start of the operation, all of the quick-feed belts 11, the upper feed roller 23, and the spacing pins 25 are in their home positions. In this state, a first board P1 is fed by the feed belts 7 of the board feeder 5 and, when the leading half portion thereof has passed the support roller 8, the board inclines until the leading edge thereof rests on the quick-feed belts 11.

Figure 6B:
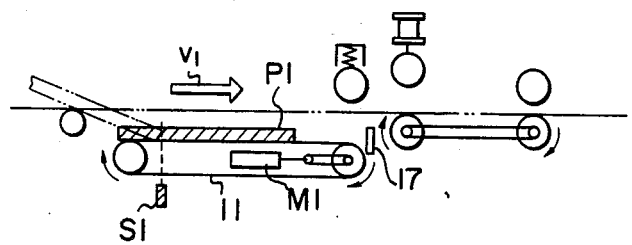

Referring to FIG. 6B, when the sensor S1 has detected the board P1, the quick-feed belts 11 are driven by the motor M1 at the higher speed, so that the board P1 is fed at the higher velocity $v_1$.

Figure 6C:
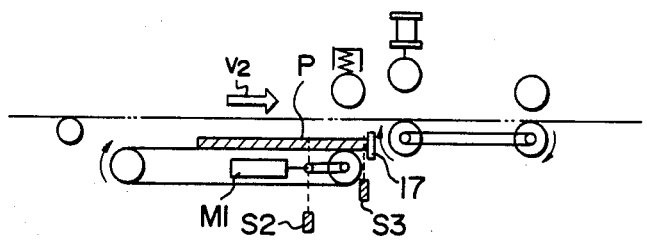

Referring to FIG. 6C, when the sensor S2 has detected the leading end of the board P1, the motor M1 is switched to the lower-speed operation, so that the board P1 is decelerated to the lower velocity $v_2$ and runs against the stopper 17. The sensor S3 then detects the board P1 and causes the motor M1 and, thus, the quick-feed belts 11 to stop, so that the board P1 stays in that position, i.e., the waiting position. At the same time, the output signal from the sensor S3 causes the cylinder actuator SY1 to actuate the alignment roller unit 19 in the direction of the arrow Z1, as shown in FIG. 4, to push the board P1 aside against the guide roller unit 18, aligning the board P1 in the right position and ensuring that it is accurately oriented.

Figure 6D:
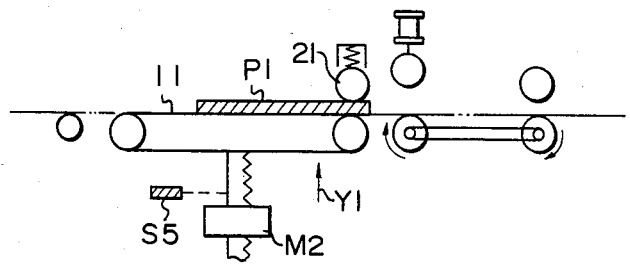

Referring to FIG. 6D, the output signal from the sensor S3 further causes the motor M2 to operate and lift the quick-feed belts 11 to the upper position, as shown by the arrow Y1, and thus the board P1 is clamped between the belts 11 and the clamp rollers 21 at the feed position on the feed path T. When the quick-feed belts 11 have reached the upper position, the sensor S5 detects this position and causes the motor M2 to stop.

Figure 6E:
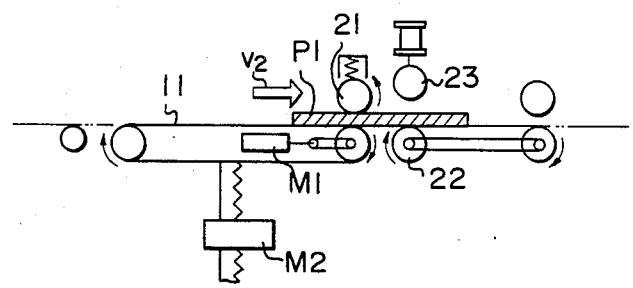

Then, referring to FIG. 6E, the output signal of the sensor S5 causes the motor M1 to operate again at the lower speed, so that the board P1 is fed at the lower speed $v_2$ by the quick-feed belts 11 and the clamp rollers 21 from the feed position and through the feed rollers 22 and 23.

Figure 6F:
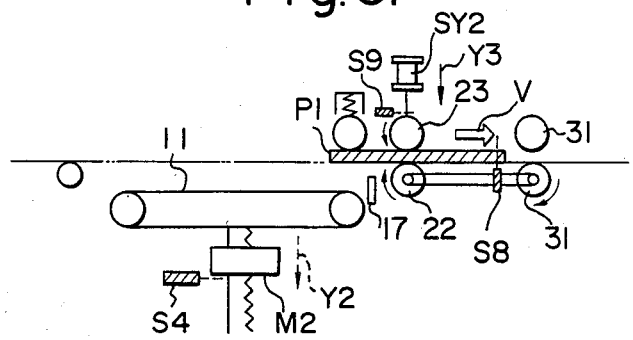

Referring to FIG. 6F, when the leading end of the board P1 is detected by the sensor S8, the motor M1, and thus the quick-feed belts 11, are stopped. At the same time, the cylinder actuator SY2 is operated to move the upper feed roller 23 downward in the direction of the narrow Y3, so that the board P1 is clamped and is fed at the regular velocity V. On the other hand, the sensor S9 detects the movement of the upper feed roller 23 to the lower position and causes the motor M2 to be driven in reverse to move the quick-feed belts 11 down in the direction of the arrow Y2. When returned to the home position, the quick-feed belts 11 are detected by the sensor S4, and the motor M2 is stopped. The output signal from the sensor S9 also causes the cylinder actuator SY1 to actuate the alignment roller unit 19 in the direction of the arrow Z2, as shown in FIG. 4.

Figure 6G:
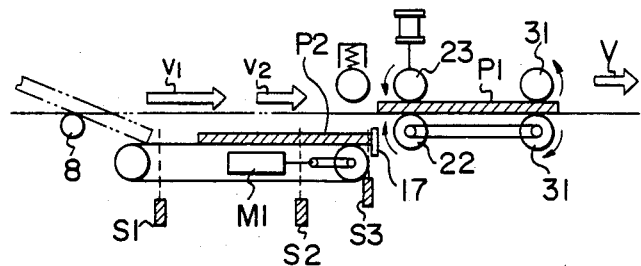

Referring to FIG. 6G, the first board P1 fed at the regular velocity V by the feed rollers 22 and 23 is then fed into the feed rollers 31 in the laminating section 3, continuously at the regular velocity V. On the other hand, a second board P2 is fed from the board feeder 5 onto the quick-feed belts 11 returned to the home position, then fed at the higher velocity $v_1$ and the lower velocity $v_2$, stopped in the waiting position, and pushed aside, in the same manner as described above with reference to FIGS. 6A to 6C.

Figure 6H:
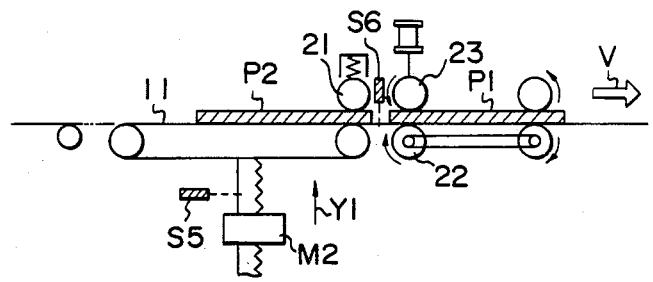

Referring to FIG. 6H, when the trailing end of the first board P1 has passed the sensor S6, the motor M2 is operated so that the quick-feed belts 11 are lifted up and the second board P2 is clamped by the clamp rollers 21.

Figure 6I:
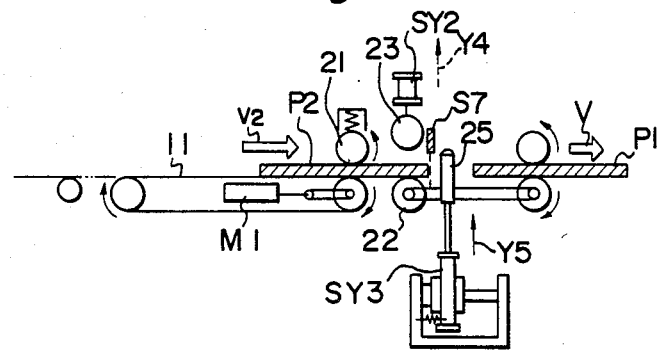

Referring to FIG. 6I, when the trailing end of the first board P1 has passed the sensor S7, the cylinder actuator SY3 is operated so that the spacing pins 25 are moved up in the direction of the arrow Y5 and inserted between the boards P1 and P2. At the same time, the cylinder actuator SY2 is operated so that the upper feed roller 23 is moved up in the direction of the arrow Y4 to return to the home position. At the same time, the motor M1 is operated at the lower speed, so that the second board P2 is fed at the lower velocity $v_2$ by the quick-feed belts 11 and the clamp rollers 21.

Figure 6J:
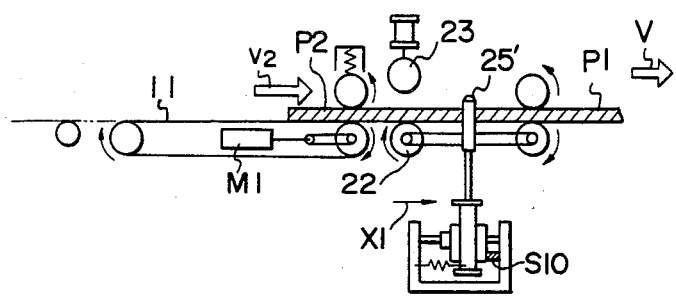

Referring to FIG. 6J, the second board P2 being fed at the lower velocity $v_2$ pursues the first board P1 being fed at the regular velocity V ($V_2 > V$), with the leading end thereof pushing the spacing pins 25 in the direction of arrow X1 until the spacing pins 25 strike the trailing end of the first board P1. As a result, the predetermined gap d is established between the first board P1 and the second board P2.

Figure 6K:
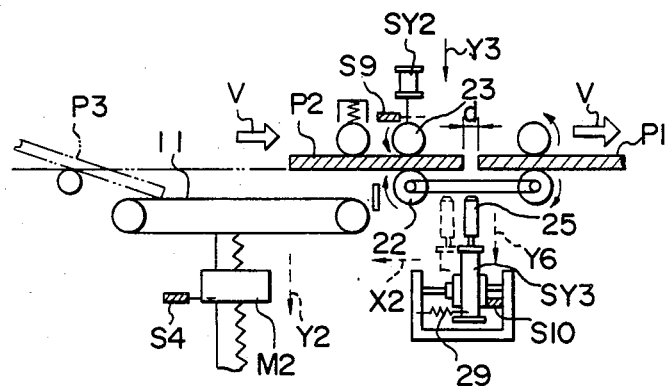

Referring to FIG. 6K, when the spacing pins 25 have reached the subsequent position, the sensor S10 detects this position and causes the cylinder actuator SY2 to actuate the upper feed roller 23 and to move it down in the direction of the arrow Y3, so as to clamp the second board P2. At the same time, the cylinder actuator SY3 is operated to extract the spacing pins 25 from the gap between the boards P1 and P2 in the direction of the arrow Y6. As a result, the boards P1 and P2 are continuously fed at the regular velocity V, with the predetermined gap d therebetween. The spacing pins 25 extracted downward are returned in the direction of the arrow X2 to the preceding home position (shown by the dotted line) by the restoring spring 29. At the same time, the downward movement of the upper feed roller 23 is detected by the sensor S9, and, as described hereinbefore, the quick-feed belts 11 are moved down in the direction Y2 by the motor M2 to return to the home position.

Thereafter, the same steps as described above for the second board P2 are repeated for a third board P3 (FIG. 6K) and all succeeding boards. Note, that, as can be seen from FIG. 7, the sensor 8 is used only for detecting the first board P1.

Thus, in the above-described manner, the boards P fed from the board feeder 5, even if the board gaps are irregular when the boards are fed, are regularly rearranged in the timing section 2, with the predetermined constant gap therebetween, and then continuously fed into the laminating section 3.

3. Laminating Section

Figure 8:
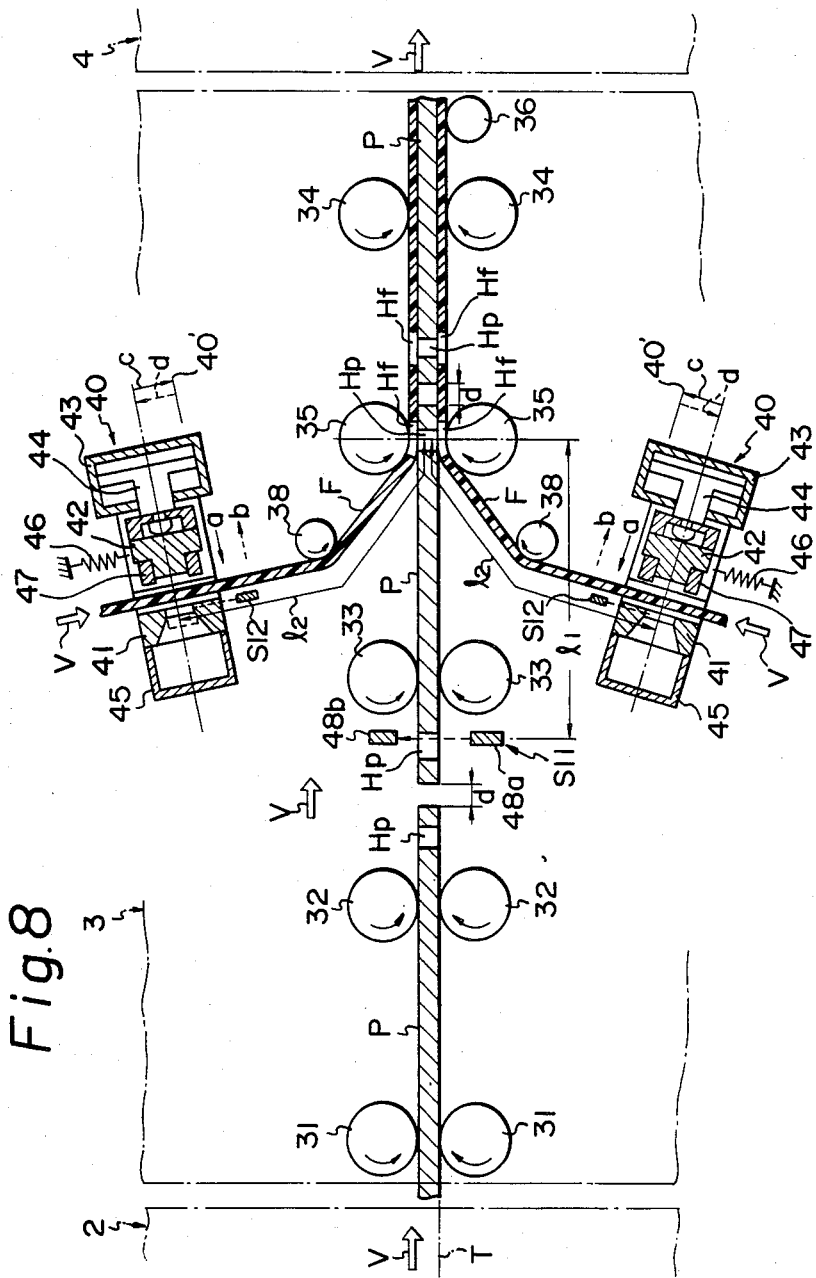
FIG. 8 is a partially sectioned, side view of the main portion of the laminating section of the laminator.

Referring to FIG. 8, the laminating mechanism in the laminating section 3 has the feed rollers 31, 32, 33, and 34 and the laminating rolls 35, which are substantially equidistantly arranged along the board feed path T and constantly driven to rotate synchronously with each other, whereby the boards P fed from the preceding timing section 2 are continuously fed in the direction of the arrow at the regular velocity V, with the gap d therebetween maintained, via the laminating rolls 35. Note that, for the laminating system, a known atmospheric pressure system or vacuum system may be used for the present invention. The illustrated embodiment uses the vacuum system, and in which the feed rollers 31 and 34 at the opposite ends also serve as seal rollers to maintain an airtight condition.

As illustrated in FIG. 3, the resist film reels 37 are disposed above and below the board feed path T, respectively, and loaded with rolls of resist film F. The resist films F are unwound from these reels 37, and, shown in FIG. 8, fed to the laminating rolls 35, with the long film maintained unbroken, via guide rollers 38, at the same velocity as the velocity V for feeding the boards P, and then continuously laminated by thermocompression on the top and bottom surfaces of the board P, respectively.

Figure 9:
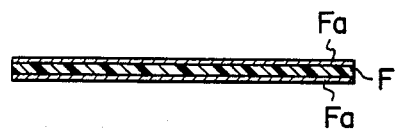
FIG. 9 is a cross-sectional view of a resist film.
Figure 10:
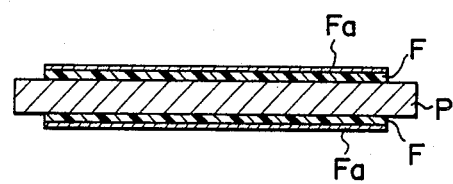
FIG. 10 is a cross-sectional view of the baseboard and resist film after the lamination.

As shown in cross section in FIG. 9, when the resist film F is wound, both surfaces thereof are covered with thin protective films Fa of, for example, polyethylene. When unwound from the reel 37, the protective film Fa on one surface is stripped off by a stripper (not illustrated), and the resist film F is laminated on the board P by the surface from which the protective film has been stripped, as shown in cross section in FIG. 10. Usually, the resist film F has a width smaller than that of the board P and, as can be seen from FIGS. 2 and 10, is laminated on the board P in the central region, but not on the side regions in which a conductor pattern is not formed. In the resist film-cutting step described hereinafter, a photosensor detects the board gap in this side region of the board, on which the resist film is not laminated, and causes the film-cutting operation to be performed.

Figure 11:
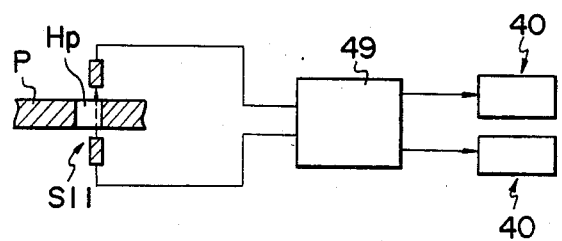
FIG. 11 is a diagrammatic view of a control system of the access hole-making mechanism.

As shown in FIGS. 8 and 11, the access-hole making mechanism in the laminating section 3 comprises: (a) photosensors S11 for detecting the indexing holes Hp in the board P, which sensors S11 are disposed in the board feed path T adjacent to the laminating rolls 35 and each of which has a light emitting cell 48a and a photoelectric receiving cell 48b; and (b) the die-punch units 40 for making the access holes Hf in the resist film F corresponding to the indexing holes Hp in the board P. These units 10 are disposed in the resist-film feed path between the resist film reels 37 (FIG. 3) and the laminating rolls 35, respectively. In the illustrated embodiment, as can be seen from FIGS. 2 and 4, the indexing holes Hp are formed in both sides of the board P, and accordingly, two indexing hole-detecting sensors S11 are disposed on both sides of the board feed path T, and four die-punch units 40 are also disposed on both sides, i.e., two upper and lower units on each side. However, only one sensor S11 and two die-punch units 40 on one side are illustrated in the figures.

As illustrated in cross section in FIG. 8, the die-punch unit 40 has a die 41 and a punch 42 opposed to each other, with the resist film F continuously fed therebetween. The punch 42 is connected to a piston rod 44 of a cylinder actuator 43 using, for example, compressed air. When the sensor S11 has detected the reference hole Hp, the output signal therefrom causes the cylinder actuator 43 to actuate the punch 42 toward the die 41 as shown by the arrow a, to punch the resist film F and make the access hole Hf, as described hereinafter. When a photosensor, S12 disposed on the side of the die 41 detects that the punch 42 has pierced the resist film F and has reached the die 41, the cylinder actuator 43 is operated in reverse to extract the punch 42 from the die 41 and the resist film F, as shown by the arrow b. The reference numeral 47 designates a stripper used for extracting the punch 42. The light path for the sensor S12 can be provided by making a perforation or slit in a part of the die 41. The punched scraps of the resist film F are received in a receiver 45 secured to the die 41, and accordingly, the surfaces of the board P and the interior of the apparatus are kept clear of debris, etc. When the access holes are punched, since the resist film F is continuously fed at the regular velocity V, the die-punch unit 40 is adapted to move, together with the resist film F, from home position to the punching-over position 40', as shown by the arrow c. Therefore, during the time when the punch 42 is being inserted into the die 41, the unit 40 is trailed by the resist film F to the neighborhood of the punching-over position 40', and, when the cylinder actuator 43 has operated in reverse, and thus the punch 42 has been extracted from the die 41 and the resist film F, the unit 40 is returned to the home position by a restoring spring 46, as shown by the arrow d.

In the illustrated embodiment, the indexing hole-detecting sensors 11 and the die punch unit 40 are disposed in such a manner that the respective distances $l_1$ and $l_2$ thereof from the laminating rolls 35 are equal to each other (i.e., $l_1 = l_2$). At the same time as the sensor S11 detects the indexing hole Hp in the board P, the die-punch unit 40 makes the access hole Hf in the resist film F. As a result, the access hole Hf is made at the same distance from the laminating rolls 35 as that of the indexing hole Hp detected by the sensor S11. Accordingly, as illustrated in FIG. 8, when the holes Hp and Hf arrive at the laminating rolls 35, they are exactly aligned with each other. According to this arrangement of the sensor S11 and the die-punch unit 40, even if the velocity V of the feeding of the board P and the resist film F is varied, the relative position between the indexing hole Hp and the access hole Hf is not varied, and accordingly, an exact alignment can be always obtained without the need for adjustment.

Alternatively, the distances $l_1$ and $l_2$ of the sensor S11 and the die-punch unit 40 may be different from each other. In this case, however, $l_1$ should be larger than $l_2$ (i.e., $l_1 > l_2$), and the die-punch unit 40 must make the access holes a certain constant period of time later, after the sensor S11 has detected the indexing hole Hp. This period of time is determined by the difference in distance ($l_1 - l_2$) and the velocity V of the board feed and the resist film feed, i.e., $(l_1 - l_2)/V$. This can be established by, for example, providing a control circuit 49 in the access hole-making mechanism illustrated in FIG. 11, with a pulse generator, which generates a number of pulses in proportion to the velocity of the board and the resist film feed, and with a pulse counter to generate a signal for the operation of the die-punch unit 40 after the predetermined number of pulses corresponding to the time of period of $(l_1 - l_2)/V$ has been counted, after receiving the indexing hole-detecting signal from the sensor S11.

In the above-described manner, the laminating section 3 can automatically, efficiently and precisely make the access holes in the resist films F, prior to lamination, by using the access hole-making mechanism, and laminate the resist films F on the boards P by using the laminating mechanism.

After the lamination, the boards P are fed into the subsequent cutting section 4, via the subsequent feed rollers 34 and the support rollers 36, while being interconnected by the resist films F, with the predetermined gap d therebetween.

4. Cutting Section

Figure 12:
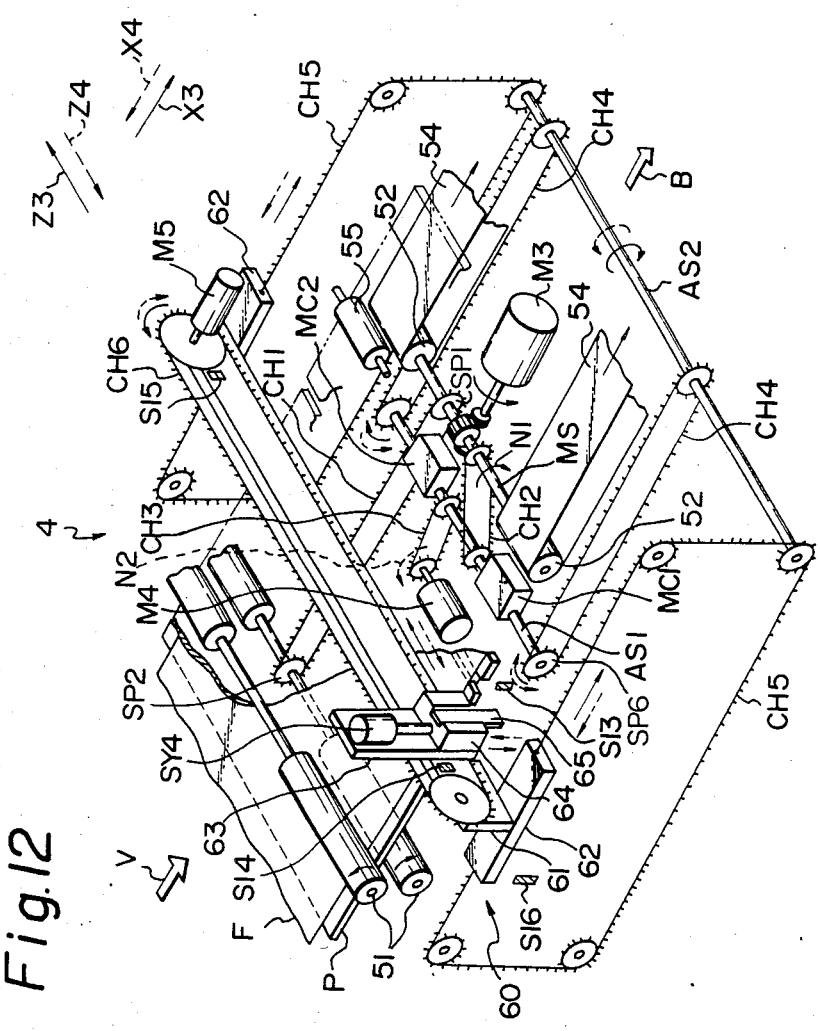
FIG. 12 is a perspective view of a first embodiment of the cutting section of the laminator.

Referring to FIGS. 3 and 12, in the cutting section 4, the feed rollers 51 are disposed in the preceding region, and two feed belts 54 are disposed in the subsequent region, along the board feed path T. The feed belts 54 are horizontally supported by pulleys 52 and 53 (shown in FIG. 3), and driven rollers 55 (only one is illustrated in FIG. 12) are disposed above the pulleys 52. The feed rollers 51 and the feed belts 54 continuously feed the train of boards P delivered from the laminating section 3 and interconnected by the resist film in the direction of the arrow B at substantially the same velocity as the velocity V of the board feed in the laminating section 3. Therefore, referring to FIGS. 12 and 13, the pulleys 52 for the feed belts 54 are secured to a main shaft MS, which is driven by a main motor M3 via a worm-and-gear W, in the direction of the arrow N1, so that the feed belts 54 are driven in the same direction. On the other hand, the feed rollers 51 are driven by a chain CH1, which engages a sprocket wheel SP1 secured to the main shaft MS and a sprocket wheel SP2 (FIG. 12) secured to the lower feed roller 51. Preferably, the number of sprockets of the wheel SP2 should be larger than that of the sprocket wheel SP1 (i.e., SP1°SP2), so that the peripheral velocity of the feed rollers 51 is equal to the regular velocity V, while the velocity of the feed belts 54 is equal to a velocity V' slightly larger than V (i.e., $V < V'$). The advantage stemming from this construction will be described hereinafter.

Figure 15:
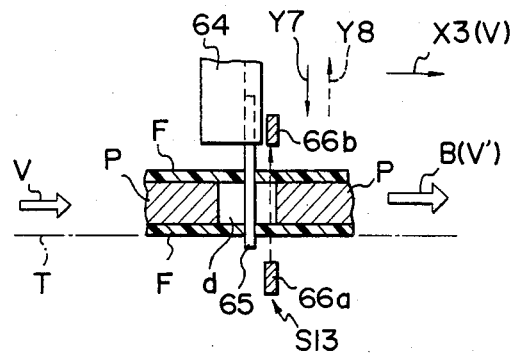

Between the feed rollers 51 and the feed belts 54 are disposed a sensor S13 for detecting the gap d between the boards P of the continuously fed board train, and the cutter 60 for cutting the resist film F of the board train at the portions corresponding to the gaps d. The sensor S13 is a photosensor having a light emitting cell 66a and a photoelectric receiving cell 66b as shown in FIG. 15, and is disposed on one side of the board train feed path T, so that the board gap d is detected in the side region of the board P in which the resist film F is not laminated, as described hereinbefore.

Referring to FIG. 12, the cutter 60 has a cutter base 61, which has a length longer than the width of the board P and is disposed above the board train feed path T perpendicular to the direction B of the feed of the board train. The cutter base 61 is supported at opposite ends on support plates 62, which are movable along guide rails (not illustrated), disposed on opposite sides of the board train feed path T, in directions (arrows X3 and X4 in FIG. 12) parallel to the board train feed direction B.

The cutter base 61 is provided with a cutter carriage 63, which is reciprocally movable along guide rails (not illustrated) in the longitudinal direction of the cutter base, i.e., the horizontal direction (as shown by the arrows Z3 and Z4 in FIG. 12) perpendicular to the board train feed direction B. The cutter carriage 63 is provided with a cutter holder 64, which can be moved upward and downward (as shown by the arrows Y7 and Y8 in FIG. 15) by a cylinder actuator SY4 and holds a cutter blade 65 in the form of a razor blade or the like. When the cutter holder 64 is moved by the cylinder actuator SY4 upward and downward in the directions of arrows Y7 and Y8, the cutter blade 65 is moved between a home position located above the top surface of the board train and a cutting position (FIG. 15) in which it projects beyond the bottom surface of the board train.

The cutter is further provided with a reversible motor M5 and a chain CH6 for driving the cutter carriage 63, and thus the cutter blade 65, in the directions of the arrows Z3 and Z4. The chain CH6 is supported by sprocket wheels disposed at opposite ends of the cutter base 61, and both ends thereof are secured to the cutter carriage 63. The motor M5 is mounted on one of the cutter base support plates 62 and is connected to one of the sprocket wheels for the chain CH6. Accordingly, when the motor M5 rotates in the regular direction, the cutter carriage 63 moves from the home position shown in FIG. 12 to the opposite cutting-finish position, above the board train, in the direction of the arrow Z3. When the motor M5 rotates in the reverse direction, the cutter carriage 63 moves from the cutting-finish position to the home position in the direction of the arrow Z4. The reference characters S14 and S15 (FIG. 12) designate photosensors or microswitches for detecting the home position and the cutting-finish position of the cutter carriage 63, respectively.

The cutter base 61 is also moved reciprocally in the directions of the arrows X3 and X4 by the drive mechanism described below. As shown in FIG. 12, on each side of the board train feed path T, a chain CH5 is supported by four sprocket wheels, rectangularly disposed as viewed from the side, and both ends thereof are secured to the front and rear ends of the corresponding cutter base support plate 62. One of the four sprocket wheels for the chain CH5 is connected to a common second auxiliary shaft AS2 which is, in turn, connected to sprocket wheels SP6 at the opposite ends of a first auxiliary shaft AS1 (shown clearly in FIG. 14) by two chains CH4.

Figure 13:
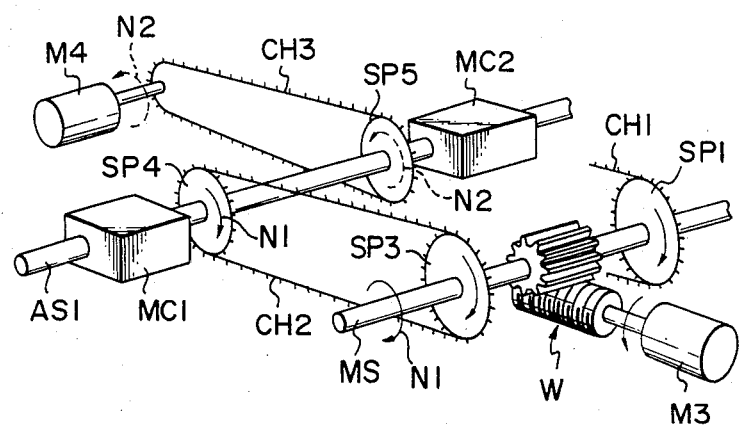
FIGS. 13, 14, and 15 are detailed perspective, top and side views respecitvely of the main portions of the cutting section shown in FIG. 12.
Figure 14:
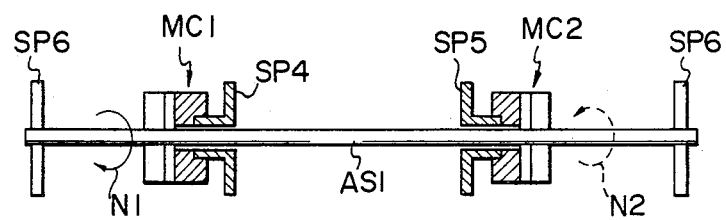

As shown clearly in FIGS. 13 and 14, the first auxiliary shaft AS1 is provided with two sets of sprocket wheels SP4 and SP5 and magnetic clutches MC1 and MC2. The first sprocket wheel SP4 is connected to a sprocket wheel SP3 secured to the main shaft MS by a chain CH2, and the second sprocket wheel SP5 is connected to the output shaft of an auxiliary motor M4 by a chain CH3. The magnetic clutches MC1 and MC2 connect or disconnect the sprocket wheels SP4 and SP5 to and from the first auxiliary shaft AS1, respectively, by using electromagnetic force. In the normal condition, the clutches MC1 and MC2 are OFF and the sprocket wheels SP4 and SP5 are disconnected. In this condition, the first auxiliary shaft AS1 is not driven by the motors M3 and M4, and thus the cutter base 61 is not driven to the home position adjacent to the feed rollers 51. When the first clutch MC1 is turned ON, the first auxiliary shaft AS1 is connected to the sprocket wheel SP4 and driven by the main shaft MS (i.e., the main motor M3), via the chain CH2, to rotate in the same regular direction N1, whereby, as can be seen from FIG. 12, the cutter base 61 is driven, via the chains CH4, the second auxiliary shaft AS2 and the chains CH5, and moves in the same direction (as shown by the arrow X3) as the board train feed direction B. The velocity of the movement of the cutter base 61 in the direction of the arrow X3 is the same as the board feed velocity V. When the first clutch MC1 is turned OFF and the second clutch MC2 is turned ON, the first auxiliary shaft AS1 is disconnected from the sprocket wheel SP4 and connected to the other sprocket wheel SP5, and is driven by the auxiliary motor M4, via the chain CH3, to rotate in the reverse direction N2 opposite to the direction N1 of the rotation of the main shaft MS. Accordingly, as shown in FIG. 12, the chains CH4, the second auxiliary shaft AS2, and the chains CH5 are also driven in the reverse direction, so that the cutter base 61 is driven in the direction of the arrow X4 to return to the home position. Reference character S16 designates a photosensor or microswitch for detecting the home position of the cutter base support plates 62, and thus, the cutter base 61.

In the above-described cutting section 4, the cutting of the resist films F of the board train is performed as follows. When the board train delivered from the preceding laminating section 3 is fed by the feed rollers 51 and the feed belts 54 at the regular velocity V and, as shown in FIG. 15, the gap d between the boards P has arrived at the position of the sensor S13, the latter detects the trailing end of the preceding board P, and thus the cylinder actuator SY4 is operated so that the cutter blade 65 is moved downward as shown by the arrow Y7 to the cutting position. At the same time, the motor M5 is operated to move the cutter carriage 63 in the direction of the arrow Z3. Further, at the same time as the cutter blade 65 moves downward, the first clutch MC1 is turned ON, and the cutter base 61 is moved by the main motor M3 in the direction of the arrow X3 at the regular velocity V. Therefore, the cutter blade 65, while moving in the same direction X3 and at the same velocity V as the board train, as shown in FIG. 15, traverses the board train in the direction of the arrow Z3 (FIG. 12) and through the gap d between the boards (the locus of the movement of the cutter blade 65 is oblique to the board train feed direction B as shown by the dotted line in FIG. 2), in such a manner that the resist films F on the both surfaces are cut along the center line of the gap d. In this case, the preceding board P is fed by the feed belts 54, and the succeeding board P is fed by the feed rollers 51. As described hereinbefore, the feed velocity V' of the feed belts 54 is slightly larger than the feed velocity V of the feed rollers 51, and consequently the resist films F interconnecting with the boards P are under a slight tension, thereby ensuring good cutting.

When the cutting is finished and the cutter blade 65 has reached the cutting-finish position (designated by 65' in FIG. 2), the sensor S15 detects this state and stops the cutter-driving motor M5 to stop the cutter carriage 63, and, at the same time, the first clutch MC1 is turned OFF to stop the cutter base 61, and further, the cylinder actuator SY4 is operated in the reverse direction to move the cutter blade 65 as shown by the arrow Y8 to the home position. Thereafter, the motor 5 is operated in the reverse direction, so that the cutter carriage 63 returns to the home position as shown by the arrow Z4 and stops when detected thereat by the sensor S14. At the same time, the second clutch MC2 is turned ON, so that the cutter base 61 is driven by the auxiliary motor M4 to return to the home position and stops when detected thereat by the sensor S16.

The board P separated from the board train after the resist films F are cut is fed by the feed belts 54 in the direction of the arrow B at the velocity V', which is slightly larger than the board train feed velocity V, as described above, with the distance from the board train being gradually increased, and delivered to a next board-processing section or board accumulator, not illustrated.

As described above, the cutting section 4 can carry out the cutting of the resist films, after the lamination, in an automatic and efficient manner and, in addition, with a good cutting-finish, without causing damage to the board P and the resist films.

Figure 17:
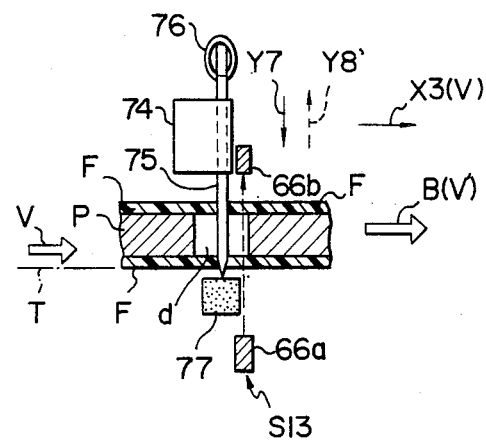
FIG. 17 is a detailed side view of the main portion of the cutting section shown in FIG. 16.

Next, a second embodiment of the cutting section will be described. A cutting section 4A illustrated in FIGS. 16 and 17 is basically the same in construction and operation as the above-described cutting section 4, except that the construction and operation of a cutter 70 are slightly different from those of the above-described cutter 60. That is, the board train delivered from the laminating section 3 is fed by the feed rollers 51 and the feed belts 54, and the gaps d therein are detected by the sensor S13, in the same manner as in the first embodiment. Moreover, the cutter 70 has a cutter base 71 and cutter base support plates 72, which are the same as those of the cutter 60, described above, and the cutter base 71 is driven reciprocally in the directions of the arrows X3 and X4 by the same drive mechanism as that for the cutter 60. Accordingly, only the differences between the cutter 70 and the cutter 60 will be described below.

The cutter base 71 of the cutter 70 is provided with a pair of cutter support plates 73 secured thereto at opposite ends thereof. These cutter support plates 73 are provided with cutter holders 74 which can be moved upward and downward (as shown by the arrows Y7 and Y8 in FIG. 17) by cylinder actuators SY5 using, for example, compressed air. The cutter holders 74 hold a cutter blade 75 attached thereto, with heat-insulating material placed therebetween, and having a length larger than the width of the resist film F. The cutter blade 75 is equipped at the upper portion thereof with a heater 76, example, a nickel-chrome wire heater, which heats the cutting edge portion of the cutter blade 75 to a predetermined temperature (for example, 70° to 80° C.). Note, the cutter blade 75, even when not heated, may carry out the cutting without difficulty, but, when the blade 75 is heated, cutting becomes very much easier. The heater need not always be attached to the cutter blade 75, but can be incorporated in a larger size cutter holder. The cylinder actuators SY5 actuate the cutter holders 74 to move up and down, so that the cutter blade 75 is moved up and down between the home position and the cutting position (FIG. 17). The reference characters S17 and S18 designate photosensors or microswitches for detecting the home position and the cutting position of the cutter blade 75.

According to the above-described construction, when the sensor S13 has detected the board gap d in the board train, the cylinder actuators SY5 are operated to move the cutter blade 75 down in the direction of the arrow Y7, and, at the same time, the first clutch MC1 is turned ON so that the cutter base 71 is driven by the main motor M3 in the direction of the arrow X3 at the regular velocity V, as in the case of the cutter 60. Therefore, the cutter blade 75, while moving in the same direction X3 and at the same velocity V as the board train, as shown in FIG. 17, moves down in the direction of the arrow Y7 and through the gap d between the boards P, so that the resist films F on both sides are heated and cut. The reference numeral 77 (FIG. 17) designates a cushion for the cutter blade 75. When the cutting is finished, the sensor S18 causes the cylinder actuators SY5 to operate in the reverse direction, so that the cutter blade 75 is moved in the direction of the arrow Y8 and returned to the home position. Then, the sensor S17 causes the first clutch MC1 to turn OFF and the second clutch MC2 to turn ON, as in the case of the cutter 60, so that the cutter base 71 is driven by the auxiliary motor M4 in the direction of the arrow X4 to return to the home position and stops when detected by the sensor S16.

In this manner, the cutting section 4A of the second embodiment can automatically and efficiently cut the resist films, as in the cutting section 4 of the first embodiment.

The laminator described above has the following advantages:

(a) It is possible to continuously feed the boards into the laminating section, accurately aligned in the direction of the board feed and with a predetermined constant gap therebetween, by the constant-gap board feed mechanism in the timing section. This makes it possible to perform an efficient and precise continuous lamination of the long resist film in the laminating section and a good cutting of the resist film in the cutting section.

(b) In the laminating section, the resist film is continuously laminated on the boards by the laminating mechanism, and prior to the lamination, the access holes are made in the resist film, in alignment with the indexing holes in the boards, by the access hole-making mechanism. Accordingly, it is unnecessary to make the access holes by hand after the lamination. In addition, the access hole-making mechanism can make the access holes efficiently and precisely, without causing the boards and the laminator to be damaged by scraps of the resist film produced when the access holes are made.

(c) Further, the resist film of the board train after the lamination can be cut efficiently and precisely in the portions of board gap by the cutting mechanism in the cutting section. Accordingly, cutting by hand becomes unnecessary.

As described above, the present invention can provide a printed circuit board laminating apparatus, which can automatically, efficiently and precisely perform a constant-gap feed of the base boards, make the access holes in the resist film prior to the lamination, continuously laminate the resist film to the base boards, ahd cut the resist film after the lamination. As a result, automation and an improvement in productivity in the printed circuit board laminating step, and an improvement in quality, and thus yield of the printed circuit boards, can be realized. Accordingly, the economic and technical effects of this invention are extremely beneficial.

I claim:

1. A printed circuit board laminating apparatus for laminating a film on a surface of each of a plurality of baseboards corresponding to a printed circuit board comprising:
   (a) laminating means for continuously feeding a long film, and continuously laminating the film on a surface of each baseboard; and
   (b) baseboard feed means for arranging the plurality of baseboards, with a contstant gap therebetween, and feeding each baseboard to said laminating means at a first velocity, including
      (i) a regular-feed mechanism for continuously feeding a first baseboard of the plurality of baseboards to said laminating means at the first velocity,
      (ii) a quick-feed mechanism for feeding a second baseboard of the plurality of baseboards to a waiting position and then to said regular-feed mechanism at a second velocity higher than the first velocity, (iii) a spacing mechanism for spacing said first and second baseboards, with the constant gap therebetween, and (iv) a lifting mechanism for moving said quick feed mechanism and down between a lower position, in which the quick-feed mechanism feeds the first and second baseboards, to the waiting position, and an upper position, in which the quick-feed mechanism feeds the first and second baseboards, to said regular-feed mechansim.

2. An apparatus according to claim 1, wherein said quick-feed mechanism comprises a two-speed drive means for driving the quick-feed mechanism at the second and a third velocity which are both higher than the first velocity.

3. An apparatus according to claim 1, wherein the baseboard feed means further comprises alignment means for setting the first and second baseboards in the waiting position in alignment with the direction of feed of the first and second baseboards.

4. An apparatus according to claim 1, wherein said spacing mechanism comprises a spacing element movable to be inserted between and extracted from the gap between the first and second baseboards.

5. A printed circuit board laminating apparatus for laminating a film on a surface of each of a plurality of baseboards corresponding to a printed circuit board, each baseboard being provided with indexing holes, said apparatus comprising:

laminating means for continuously feeding a long film to a laminating position, and continuously laminating said film on a surface of each base board; and access hole-making means for making access holes in said film, in the feed path of the film to the laminating position, so as to be aligned with the indexing holes in each baseboard.

6. An apparatus according to claim 5, wherein said access hole-making means comprises:

a sensor disposed in the feed path of the plurality of baseboards to the laminating position for detecting the indexing holes in each baseboard; and an access hole-making unit disposed in the feed path of the film to the laminating position and responsive to the indexing hole-detecting signal from said sensor to make the access holes in the film.

7. An apparatus according to claim 6, wherein said sensor and said access hole-making unit are disposed at equal distances from the laminating position, and wherein the access hole-making unit makes the access hole, at the same time as the sensor detects the indexing hole.

8. An apparatus according to claim 6, wherein the distance ($l_2$) between the access hole-making unit and the laminating position is smaller than the distance ($l_1$) between the sensor and the laminating position, and wherein the access hole-making unit makes the access hole, after a period of time $((l_1 - l_2)/V)$ determined by the difference $(l_1 - l_2)$ between said distances and the velocity (V) of the feed of the plurality of baseboards and the film has elapsed after the sensor has detected the indexing hole.

9. An apparatus according to claim 6, wherein said access hole-making unit, when making the access hole, is movable together with the film in the direction of the feed of the film, and further comprises restoring spring means for returning the access hole-making unit to the home position after the access hole has been made.

10. An apparatus according to claim 6, wherein said access hole-making unit comprises a die and a punch disposed opposite to each other, with the film therebetween, and drive means for driving said punch.

11. An apparatus according to claim 6, wherein said access hole-making unit comprises a receiver for receiving scraps of the film produced when the access holes are made.

12. A printed circuit board laminating apparatus for laminating a film of material on a surface of each of a plurality of baseboards corresponding to a printed circuit board, each of said baseboards being provided with indexing holes, said apparatus comprising:

laminating means for continuously feeding a long film to a laminating position, and continuously laminating the film on a surface of each baseboard;

baseboard feed means for arranging the plurality of baseboards, with a constant gap therebetween, and feeding each baseboard to said laminating means at a first velocity;

access hole-making means for making access holes in the film, in the feed path of the film to the laminating position, so as to be aligned with the indexing holes in the baseboards; and cutting means for cutting the film at the portion corresponding to the gap between the baseboards which are continuously fed by the laminating means.

* * * * *

UNITED STATES PATENT AND TRADEMARK OFFICE
CERTIFICATE OF CORRECTION

PATENT NO. : 4,680,079
DATED : Jul. 14, 1987
INVENTOR(S) : TANAKA

It is certified that error appears in the above-identified patent and that said Letters Patent is hereby corrected as shown below:

Col. 7

Line 25, delete "$V(V_2 > V)$" and insert --$V(v_2 > V)$--.

Col. 8

Line 45, delete "10" and insert --40--.

Col. 10

Line 27, delete "(i.e., SP1°SP2)" and insert --(i.e., SP1 < SP2)--.

Col. 14

Line 40, delete "ahd" and insert --and--.

Signed and Sealed this

Twenty-sixth Day of January, 1988

Attest:

DONALD J. QUIGG

Attesting Officer     Commissioner of Patents and Trademarks